US006276212B1

(12) United States Patent
Cooper et al.

(10) Patent No.: US 6,276,212 B1
(45) Date of Patent: Aug. 21, 2001

(54) ULTRASONIC TRANSDUCER

(75) Inventors: Stephen R. W. Cooper, Fowlerville; Neil G. Murray, Jr., Wixom, both of MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/350,058

(22) Filed: Jul. 8, 1999

(51) Int. Cl.[7] .......................... G01N 29/00; G01P 15/02; H01L 41/04

(52) U.S. Cl. ............................... 73/632; 73/652; 310/324

(58) Field of Search ............................ 73/632, 649, 651, 73/652, 514.34, 514.29; 310/324, 334

(56) References Cited

U.S. PATENT DOCUMENTS

| | | | | |
|---|---|---|---|---|
| 3,233,465 | * | 2/1966 | Tolliver et al. | 73/517.34 |
| 3,349,629 | * | 10/1967 | Elazar | 73/514.34 |
| 3,651,353 | * | 3/1972 | Hugli et al. | 310/324 |
| 3,821,834 | * | 7/1974 | McElroy | 310/324 |
| 4,030,396 | * | 6/1977 | Mariner | 310/324 |
| 5,477,729 | * | 12/1995 | Cavalloni | 73/514.34 |
| 5,748,567 | * | 5/1998 | Mori et al. | 310/329 |

FOREIGN PATENT DOCUMENTS 19816456 6/1999 (DE) .

* cited by examiner

*Primary Examiner*—Daniel S. Larkin
*Assistant Examiner*—Rose M. Miller
(74) *Attorney, Agent, or Firm*—Tarolli, Sundheim, Covell, Tummino & Szabo L.L.P.

(57) ABSTRACT

An ultrasonic transducer (10) comprises a housing (12) having an axis (52) and a diaphragm (60) centered on the axis (52) at one end (62) of the housing (12). A cylindrical vibratable mass (74) is disposed in the housing (12) and centered on the axis (52). The vibratable mass (74) has a first end (76) secured to and centered relative to an inner surface (80) of the diaphragm (60) and an opposite second end (84). The vibratable mass (74) can be vibrated in a direction along the axis (52). A second cylindrical mass (90) is disposed in the housing (12) and centered on the axis (52). The second mass (90) has a third end (92) with a recess (100) centered on the axis (52). The second end (84) of the vibratable mass (74) extends into the recess (100) and is secured to the second mass (90). The second mass (90) resists the vibration of the vibratable mass (74) toward the second mass (90). An electrode (110) is fixed to a fourth end (94) of the second mass (90) opposite the third end (92).

13 Claims, 3 Drawing Sheets

ULTRASONIC TRANSDUCER

FIELD OF THE INVENTION

The present invention relates to an ultrasonic transducer.

BACKGROUND OF THE INVENTION

Known ultrasonic transducers produce ultrasonic waves in response to the application of an electrical signal to a piezoelectric material. In addition, known ultrasonic transducers produce an electrical signal in response to ultrasonic waves that act on a piezoelectric material.

SUMMARY OF THE INVENTION

In accordance with the present invention, an ultrasonic transducer comprises a housing having an axis and a diaphragm centered on the axis at one end of the housing. A cylindrical vibratable mass is disposed in the housing and centered on the axis. The vibratable mass has a first end secured to and centered relative to an inner surface of the diaphragm. The vibratable mass has a second end opposite the first end. The vibratable mass can be vibrated in a direction along the axis. A second cylindrical mass is disposed in the housing and centered on the axis. The second mass has a third end with a recess centered on the axis and an opposite fourth end. The second end of the vibratable mass extends into the recess and is secured to the second mass. The second mass resists the vibration of the vibratable mass toward the second mass. An electrode is fixed to a fourth end of the second mass opposite the third end.

The ultrasonic transducer produces ultrasonic waves in response to the application of an electrical signal to the vibratable mass and/or produces an electrical signal in response to ultrasonic waves acting upon the vibratable mass.

BRIEF DESCRIPTION OF THE DRAWINGS

The foregoing and other features of the present invention will become apparent to one skilled in the art to which the present invention relates upon reading the following description of the invention with reference to the accompanying drawings, wherein.

DESCRIPTION OF PREFERRED EMBODIMENTS

Figure 1:
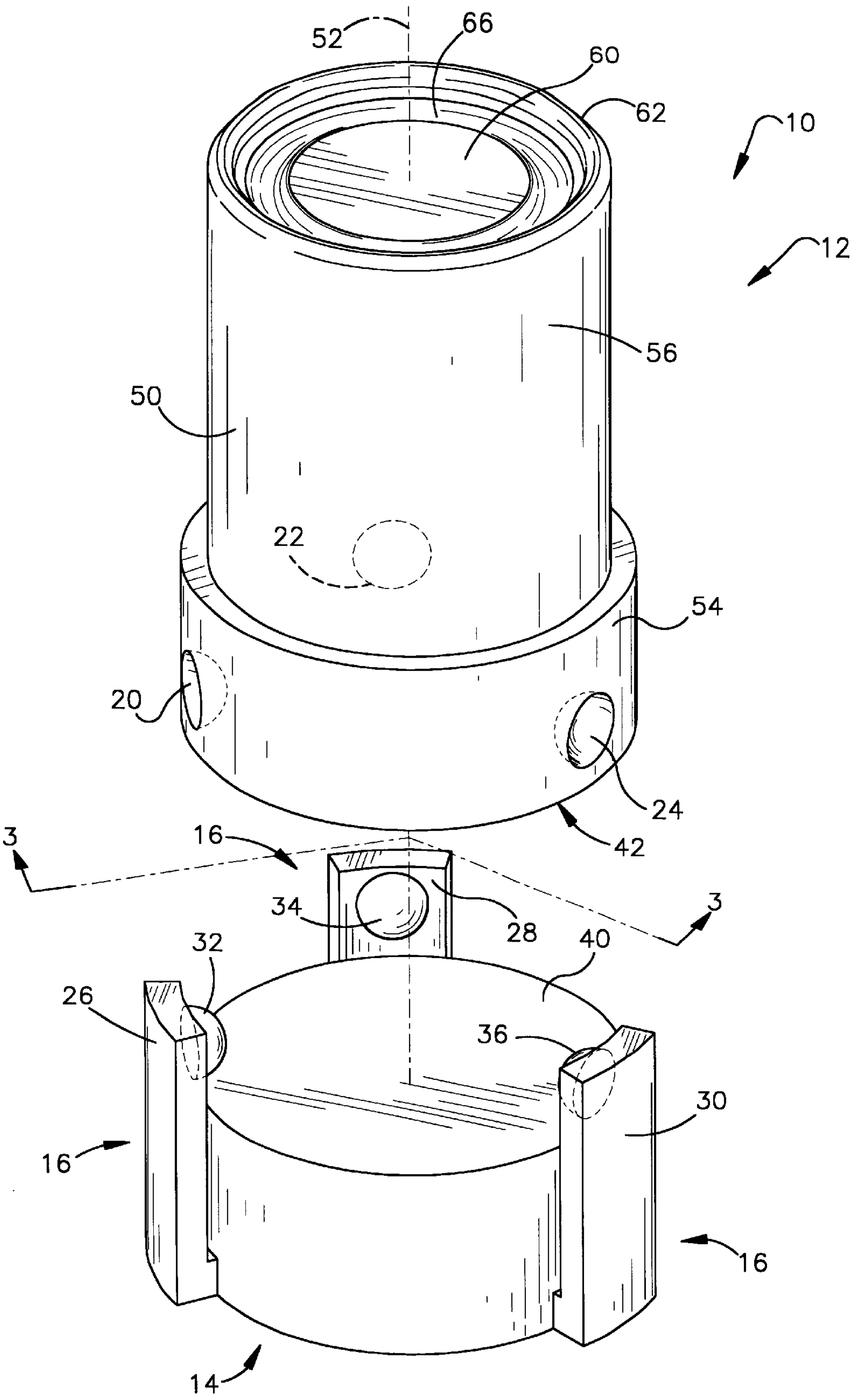
FIG. 1 is an exploded isometric view of an ultrasonic transducer according to the present invention.

An ultrasonic transducer 10 is shown in FIG. 1. The ultrasonic transducer 10 includes a cylindrical housing 12 and a base 14. Retainer elements 16 are provided to interconnect the housing 12 and the base 14.

The retainer elements 16 include a plurality of recesses 20, 22 and 24 formed in the housing 12. In addition, the retainer elements 16 include a plurality of retainer arms 26, 28 and 30 disposed on the base 14. Projections 32, 34 and 36 on the retainer arms 26, 28 and 30 are engageable with the recesses 20, 22 and 24 formed in the housing 12.

The retainer arms 26, 28 and 30 have the same arcuate spacing about the base 14 as the recesses 20, 22 and 24 have about the housing 12. Thus, the projections 32, 34 and 36 on the retainer arms 26, 28 and 30 are spaced apart by the same arcuate distance as the recesses 20, 22 and 24.

In the illustrated embodiment of the invention, there are three retainer elements 16 on the housing 12 and on the base 14. However, it is contemplated that either a greater or lesser number of retainer elements 16 could be provided on the housing 12 and base 14.

Figure 2:
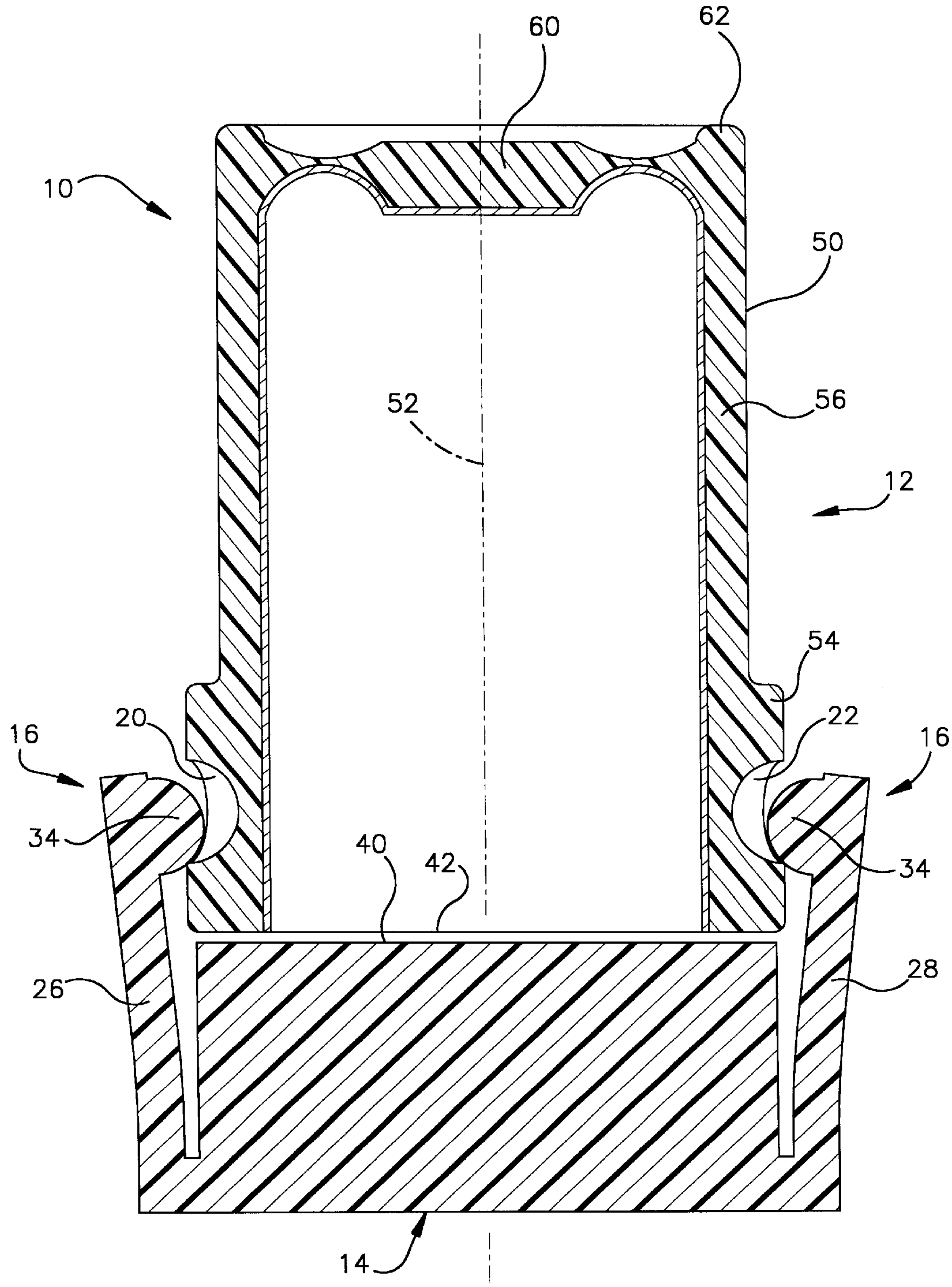
FIG. 2 is a sectional view of the ultrasonic transducer depicting the cooperation between a base and a housing of the transducer.

When the housing 12 is to be connected with the base 14, the housing 12 is moved axially downward toward a cylindrical body 40 (FIGS. 1 and 2) of the base 14. As this occurs, an annular end surface 42 of the housing 12 applies a force against the projections 32, 34 and 36. The retainer arms 26, 28 and 30 are resiliently deflected radially outward from the central axis of the cylindrical body 40 of the base 14 by the housing 12.

Further downward movement of the housing 12 toward the base 14 results in the projections 32, 34 and 36 moving into the recesses 20, 22 and 24 in the housing 12. As this occurs, the projections 32, 34 and 36 are pressed into the recesses 20, 22 and 24 by the resiliently deflected retainer arms 26, 28 and 30.

The retainer elements 16 are effective to press the housing 12 against the base 14. The projections 32, 34 and 36 on the retainer arms 26, 28 and 30 apply force against the recesses 20, 22 and 24 in the housing 12. The force applied against the recesses 20, 22 and 24 by the projections 32, 34 and 36 urges the housing 12 downward against the base 14. Thus, the annular end surface 42 of the housing 12 is pressed against the cylindrical body 40 of the base 14. By pressing the housing 12 against the base 14, a tight fit is provided between the housing 12 and the base 14.

The housing 12 includes a cylindrical side wall 50 and an axis 52. The side wall 50 has a cylindrical reinforcing section 54 and a cylindrical body section 56. When the housing 12 is connected with the base 14, the reinforcing section 54 and the body section 56 of the side wall 50 are disposed in a coaxial relationship with the cylindrical body 40 of the base 14.

The reinforcing section 54 has a greater radial thickness than the body section 56 of the side wall 50. This enables the hemispherical recesses 20, 22 and 24 to be formed in the reinforcing section 54 without significantly weakening the housing 12. The thick reinforcing section 54 avoids stressing and/or deformation of the housing 12 by the projections 32, 34 and 36 on the retainer arms 26, 28 and 30. Therefore, the acoustic properties of the housing 12 are not altered by force transmitted between the housing and the retainer arms 26, 28 and 30. In addition, the reinforcing section 54 enables the retainer arms 26, 28 and 30 to pull the housing 12 against the base 14 without deflecting the body section 56 of the side wall 50.

A circular diaphragm 60 is located at an end 62 of the housing 12 opposite from the annular end surface 42. The diaphragm 60 is centered on the axis 52 of the housing 12 and extends parallel to the annular end surface 42 of the housing 12. An annular ridge 62 extends around the diaphragm 60. The ridge 62 projects axially outward from the diaphragm 60 and helps to protect the diaphragm 60 from damage due to impact forces.

Figure 3:
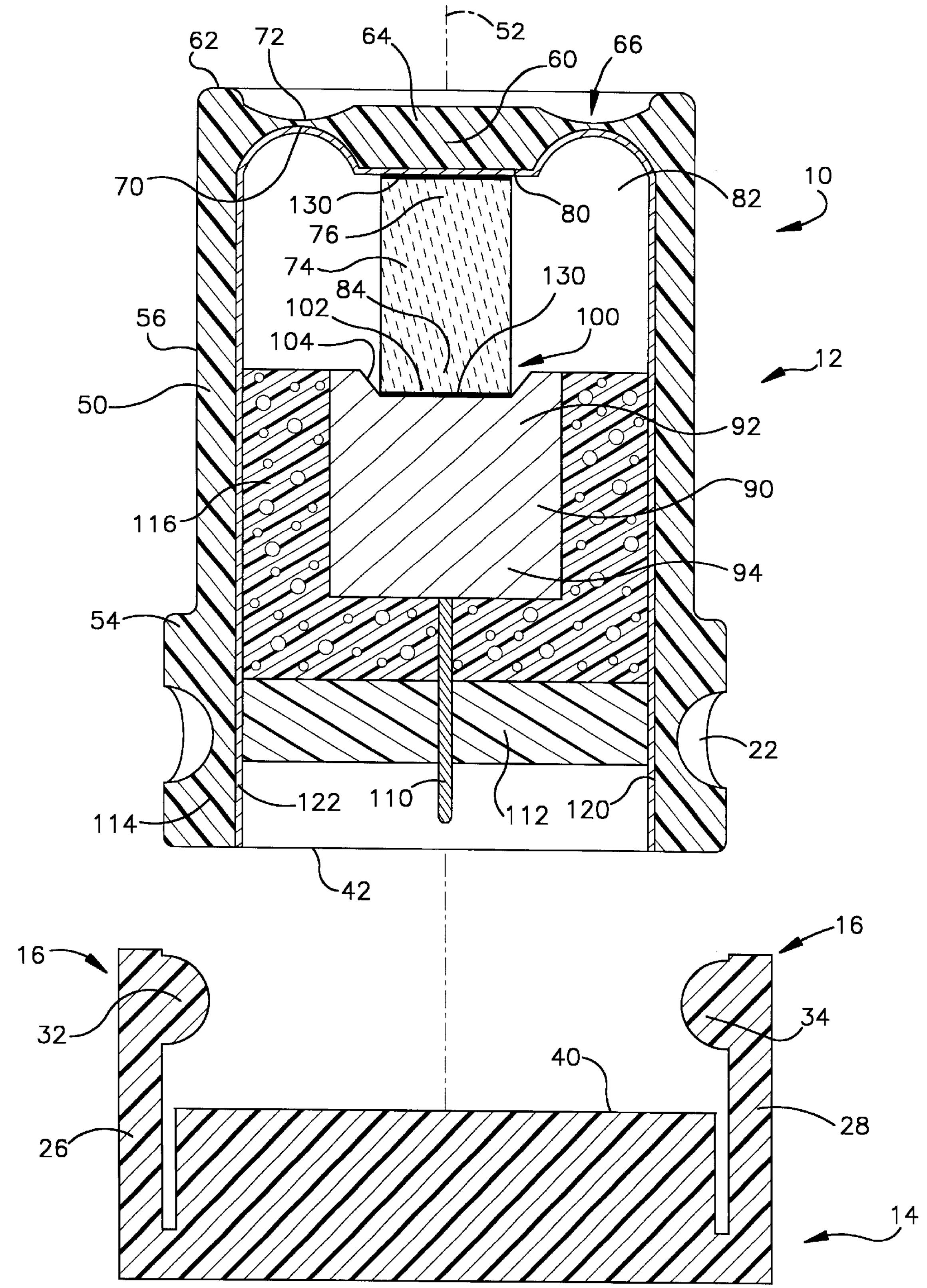
FIG. 3 is a sectional view of the ultrasonic transducer taken along line 3—3 in FIG. 1.

The illustrated diaphragm 60 (FIG. 3) has a thick circular central portion 64. The central portion 64 of the diaphragm 60 is connected with the side wall 50 of the housing 12 by a relatively thin annular connector section 66. The connector section 66 enables the relatively thick central portion 64 of the diaphragm 60 to readily vibrate relative to the side wall 50 in a direction parallel to the axis 52 of the housing. To minimize stress concentrations, the connector section 66 includes inner and outer curved surfaces 70 and 72.

The illustrated housing 12 and diaphragm 60 are integrally formed as one piece. However, it should be realized that a construction formed with separate housing 12 and diaphragm 60 components is also possible. Also, the housing 12 and diaphragm 60 may be formed of the same material or of different materials. The housing 12 and diaphragm 60 may be formed of suitable metal, plastic or polymeric materials.

A cylindrical vibratable mass 74 is centered on the axis 52 of the housing and has a first end 76 connected to an inner surface 80 of the diaphragm 60. The vibratable mass 74 extends within the interior 82 of the housing 12. The vibratable mass 74 is constructed of a piezoelectric material, such as a ceramic material, and has a second end 84 opposite the first end 76.

A second cylindrical mass 90 is centered on the axis 52 of the housing 12 and has a third end 92 positioned adjacent to the second end 84 of the vibratable mass 74. The second mass 90 has a recess 100 centered on the axis 52 of the housing 12. The recess 100 has a flat circular bottom wall 102 and a conical side wall 104 that converges as it extends into the second mass 90. The side wall 104 converges from a diameter greater than the diameter of the vibratable mass 74 to a diameter equal to the diameter of the vibratable mass 74 where the side wall 104 meets the bottom wall 102. The second end 84 of the vibratable mass 74 extends into the recess 100 and is connected to the bottom wall 102. The side wall 104 encircles the vibratable mass 74.

The second mass 90 is constructed of an electrically conductive material, such as stainless steel, and has a fourth end 94 opposite the third end 92. An electrode 110 projects from the fourth end 94 of the second mass 90. In the illustrated embodiment, the electrode 110 is centered on the axis 52 of the housing. The electrode 110 is fixed to the fourth end 94 of the second mass 90 in an electrically conductive manner, such as by a weld.

A layer of retaining material 112, such as a potting compound, seals the end 114 of the housing 12 opposite the diaphragm 60. A layer of insulating material 116, such as a closed-cell foam rubber with a relatively high durometer value, is located between the second mass 90 and the side wall 50 of the housing 12 and between the fourth end 94 of the second mass 90 and the retaining material 112. The electrode 100 extends from the second mass 90 through the insulating material 116 and the retaining material 112.

An inner surface 120 of the side wall 50, the inner surface 80 of the diaphragm 60, and the inner curved surface 70 of the connector section 66 are coated with an electrically conductive layer 122, such as an electroplated metal. In the illustrated embodiment, the first end 76 of the vibratable mass 74 is connected to the inner surface 80 of the diaphragm 60 by an electrically conductive adhesive 130. Also, in the illustrated embodiment, the second end 76 of the vibratable mass 74 is connected to the third end 92 of the second mass 90 by an electrically conductive adhesive 130.

An electrically conductive circuit is formed between the side wall 50 of the housing 12 and the electrode 110. The circuit extends through the electrically conductive layer 122 along the inner surface 120 of the side wall 50, the inner curved surface 70 of the connector section 66 and the inner surface 80 of the diaphragm 60, through the vibratable mass 74, the second mass 90, and the electrode 110. Thus, an electrical signal can be conducted through the circuit between the electrically conductive layer 122 on the side wall 50 of the housing 12 and the electrode 110. The electrical signal is conducted through the vibratable mass 74. Conversely, an electrical signal can be generated by the vibratable mass 74 and conducted through the circuit between the electrically conductive layer 122 on the side wall 50 of the housing 12 and the electrode 110.

In a transmitting mode, the ultrasonic transducer 10 is used to transmit an ultrasonic signal. An electrical signal is applied across the vibratable mass 74 via the electrical circuit between the electrically conductive layer 122 on the side wall 50 of the housing 12 and the electrode 110. In response to the electrical signal, the vibratable mass 74 vibrates in a direction along the axis 52 of the housing with the same frequency as the electrical signal. The vibrating vibratable mass 74 acts on the diaphragm 60 and the second mass 90.

The second mass 90 has a large mass relative to the mass of the vibratable mass 74 and the mass of the diaphragm 60. The second mass 90 also has a large inertia relative to the respective inertia of the vibratable mass 74 and diaphragm 60. The second mass 90 thus resists vibrating with the vibratable mass 74. As a result, during the vibration of the vibratable mass 74, the diaphragm 60 vibrates along with the vibratable mass 74 whereas the second mass 90 remains relatively stationary.

As the diaphragm 60 vibrates, it emits an ultrasonic signal. The frequency at which the diaphragm 60 vibrates is the same as the frequency at which the vibratable mass 74 vibrates. Thus, the frequency of the ultrasonic signal emitted by the diaphragm 60 is the same as the frequency of the electrical signal applied to the vibratable mass 74.

In a receiving mode, the ultrasonic transducer 10 is used to detect an ultrasonic signal. The diaphragm 60 vibrates when an ultrasonic signal acts upon it. As the diaphragm 60 vibrates, it acts upon the vibratable mass 74 which acts upon the second mass 90. The second mass 90 resists vibrating with the vibratable mass 74. As a result, the vibratable mass 74 is cyclically compressed between the diaphragm 60 and the second mass 90 in a direction along the axis 52 of the housing 12 as the diaphragm 60 vibrates.

The vibratable mass 74 provides an electrical signal when it is compressed. The vibratable mass 74 thus provides an electrical signal having the same frequency as the vibration of the diaphragm 60. The electrical signal is conducted from the vibratable mass 74 through the electrical circuit, between the electrically conductive layer 122 on the side wall 50 of the housing 12 and the electrode 110.

The recess 100 helps to position and maintain the vibratable mass 74 relative to the second mass 90. The converging side wall 104 guides the second end 84 of the vibratable mass 74 into position on the bottom wall 102 and helps to prevent the vibratable mass 74 from being displaced laterally with respect to the axis 52 of the housing 12 during operation in the transmitting and/or receiving mode.

In both the transmitting mode and the receiving mode, some slight vibration will be experienced in the second mass 90. The insulating material 116 absorbs vibration of the second mass 90 and de-couples the second mass 90 from the side wall 50 of the housing 12. This prevents any vibration of the second mass 90 from being conducted through the side wall 50 and interfering with the vibration of the diaphragm 60. The insulating material 116 also helps to isolate the ultrasonic transducer 10 from disruptive influences in the environment around the ultrasonic transducer.

From the above description of the invention, those skilled in the art will perceive improvements, changes and modifications. Such improvements, changes and modifications within the skill of the art are intended to be covered by the appended claims.

Having described the invention, the following is claimed:

1. An ultrasonic transducer comprising:

a housing having an axis and a diaphragm centered on said axis at one end of said housing;

a cylindrical vibratable mass in said housing centered on said axis, said vibratable mass having a first end secured to and centered relative to an inner surface of said diaphragm and a second end opposite said first end; said vibratable mass being vibratable in a direction along said axis;

a second cylindrical mass in said housing centered on said axis, said second mass having a third end with a recess centered on said axis, said second end of said vibratable mass extending into said recess and being secured to said second mass, said second mass resisting vibration of said vibratable mass toward said second mass; and an electrode fixed to a fourth end of said second mass opposite said third end.

2. An ultrasonic transducer as defined in claim 1 further including a layer of retaining material sealing another end of said housing opposite said one end where said diaphragm is located, said electrode being centered on said axis and projecting through said layer of retaining material.

3. An ultrasonic transducer as defined in claim 2 further including an insulating material within said housing between said second mass and said layer of retaining material and between said second mass and said housing.

4. An ultrasonic transducer as defined in claim 3 wherein said recess has a flat circular bottom wall and a conical side wall encircling said vibratable mass, said conical side wall converging as it extends into said second mass toward said bottom wall, said second end of said vibratable mass being secured to said bottom wall.

5. An ultrasonic transducer as defined in claim 1 wherein said housing and said diaphragm are integrally formed as one piece.

6. An ultrasonic transducer as defined in claim 1 wherein an interior surface of said housing and said inner surface of said diaphragm further include an electrically conductive coating.

7. An ultrasonic transducer as defined in claim 1 wherein said vibratable mass is secured to said diaphragm by an electrically conductive adhesive.

8. An ultrasonic transducer as defined in claim 4 wherein said second end of said vibratable mass is secured to said bottom wall by an electrically conductive adhesive.

9. An ultrasonic transducer as defined in claim 1 wherein said second mass is formed of an electrically conductive material.

10. An ultrasonic transducer as defined in claim 1 wherein said vibratable mass is formed of a piezoelectric material.

11. An ultrasonic transducer as defined in claim 6 wherein an electric circuit is formed between said electrode and said electrically conductive coating, said electric circuit extending through said second mass, said vibratable mass, and said inner surface of said diaphragm.

12. An ultrasonic transducer as defined in claim 11 wherein an electrical signal applied to said electric circuit between said electrode and said electrically conductive coating causes said vibratable mass to vibrate in a direction along said axis, which causes said diaphragm to vibrate and generate an ultrasonic signal.

13. An ultrasonic transducer as defined in claim 11 wherein an ultrasonic signal acts on said diaphragm causing said diaphragm to vibrate said vibratable mass, said vibratable mass generating an electrical signal in said electric circuit between said electrode and said electrically conductive coating.

* * * * *